United States Patent
Nemoto et al.

(10) Patent No.: US 7,517,777 B2
(45) Date of Patent: Apr. 14, 2009

(54) METHOD OF MANUFACTURING SEMICONDUCTOR DEVICE AND SEMICONDUCTOR DEVICE FORMED BY THE METHOD

(75) Inventors: Michio Nemoto, Matsumoto (JP); Mitsuaki Kirisawa, Higashichikusa-gun (JP); Haruo Nakazawa, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 228 days.

(21) Appl. No.: 11/464,489

(22) Filed: Aug. 14, 2006

(65) Prior Publication Data
US 2007/0048982 A1  Mar. 1, 2007

(30) Foreign Application Priority Data
Aug. 26, 2005  (JP) .............................. 2005-246037

(51) Int. Cl.
*H01L 21/425*  (2006.01)
(52) U.S. Cl. .................. 438/514; 438/795; 438/510
(58) Field of Classification Search ................ 438/268, 438/270, 510, 514, 515, 795
See application file for complete search history.

(56) References Cited

U.S. PATENT DOCUMENTS

| | | | |
|---|---|---|---|
| 5,569,624 A | 10/1996 | Weiner | |
| 6,534,380 B1 | 3/2003 | Yamauchi et al. | |
| 6,759,301 B2 | 7/2004 | Takei et al. | |
| 6,765,229 B2 | 7/2004 | Zhang et al. | |
| 6,818,568 B2 | 11/2004 | Tanaka | |
| 2003/0211694 A1* | 11/2003 | Takei et al. | 438/270 |
| 2005/0059263 A1* | 3/2005 | Nakazawa et al. | 438/784 |
| 2006/0186508 A1* | 8/2006 | Nemoto et al. | 257/492 |

FOREIGN PATENT DOCUMENTS

| | | |
|---|---|---|
| JP | 05-062924 A | 3/1993 |
| JP | 10-275781 A | 10/1998 |
| JP | 2000-349042 A | 12/2000 |
| JP | 2001-156018 A | 6/2001 |

(Continued)

OTHER PUBLICATIONS

Michio Nemoto et al.; "An Advanced FWD Design Concept with Superior Soft Reverse Recovery Characteristics"; ISPSO, May 2000, pp. 119-122, France.

(Continued)

*Primary Examiner*—Bradley K Smith
(74) *Attorney, Agent, or Firm*—Rossi, Kimms & McDowell LLP

(57) ABSTRACT

The method of manufacturing a semiconductor device includes forming a p-type anode layer and an anode electrode on one major surface of an n-type semiconductor substrate, irradiating an electron beam to the semiconductor substrate to introduce crystal defects into the semiconductor substrate, grinding the other major surface of semiconductor substrate to reduce the thickness the semiconductor substrate, implanting phosphorus ions from the exposed surface of semiconductor substrate, and irradiating pulsed YAG laser beams by the double pulse technique to the exposed surface, from which the phosphorus ions have been implanted, to activate the implanted phosphorus atoms and to recover the region extending from the exposed surface irradiated with the YAG laser beams to the depth corresponding to 5 to 30% of the total wafer thickness from the defective state caused by the crystal defects introduced therein.

22 Claims, 8 Drawing Sheets

FOREIGN PATENT DOCUMENTS

| | | |
|---|---|---|
| JP | 2001-177114 A | 6/2001 |
| JP | 2001-185504 A | 7/2001 |
| JP | 2002-520885 A | 7/2002 |
| JP | 2003-059856 A | 2/2003 |
| JP | 2003-109912 A | 4/2003 |
| JP | 2003-318412 A | 11/2003 |
| JP | 2004-282060 A | 10/2004 |
| JP | 2005-223301 A | 8/2005 |
| JP | 2006-005178 A | 1/2006 |
| WO | 00/04596 | 1/2000 |

OTHER PUBLICATIONS

Akira Nakada et al.; "Influence of flourine in BF2 and implantation on the formation of ultrashallow and low-leakage silicon p+n junctions by 450-500° C annealing"; J. Appl. Phys.; vol. 81, No. 6, Mar. 15, 1997; pp. 2560-2565.

* cited by examiner

FIG. 9
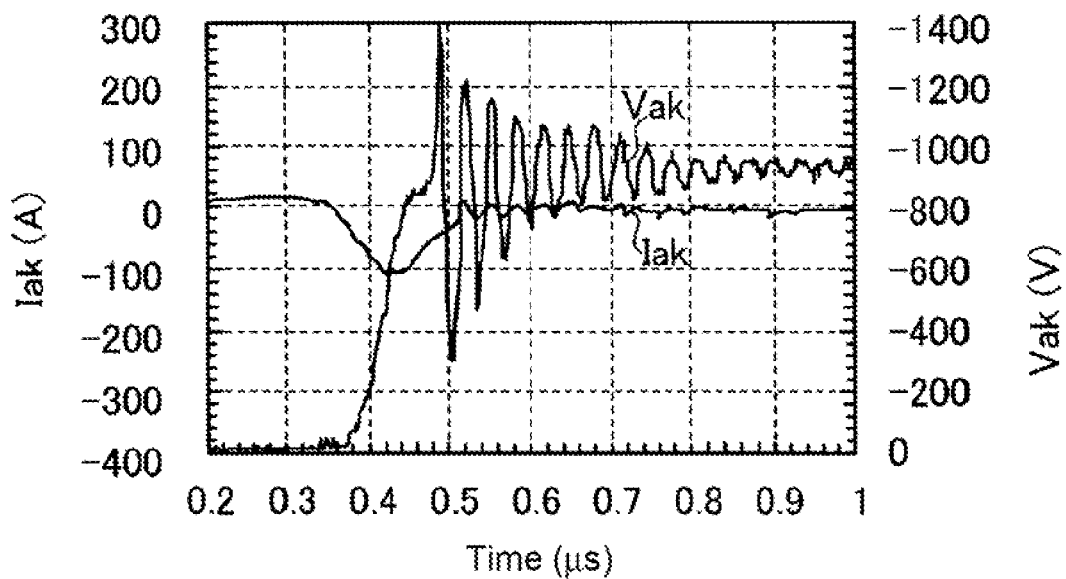
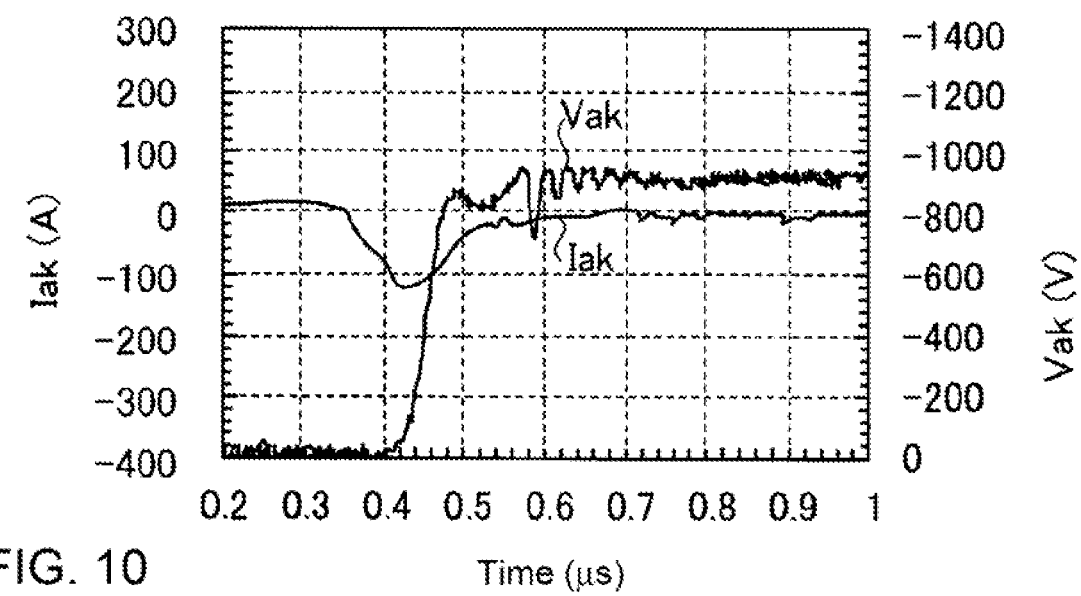
FIG. 10

METHOD OF MANUFACTURING SEMICONDUCTOR DEVICE AND SEMICONDUCTOR DEVICE FORMED BY THE METHOD

BACKGROUND

The known conventional method of manufacturing diodes, insulated gate bipolar transistors (hereinafter referred to as "IGBTs") and such power semiconductor devices uses a thick silicon wafer. At the final stage of the manufacturing process, the thick silicon wafer is ground thin and thereafter etched to form a predetermined final thickness. Thereafter, implanted ions are activated by an activation heat treatment. See for instance, published PCT application WO 00/04596 or. Japanese published patent application 2002-520885. Recently, the manufacturing process described above has been mainly employed.

Since electrodes have been formed already on the semiconductor wafer surface opposite to the surface thereof ground thin, it is necessary to conduct the activation heat treatment below the melting point of the electrode material, e.g., below 450° C. for aluminum. Due to the activation at a lower temperature, the implanted impurity ions are liable to be activated insufficiently. The other known method for obviating this problem includes forming a p-type anode layer and an anode electrode of a diode on one major surface of an FZ wafer, grinding the opposite major surface of the FZ wafer, implanting ions such as phosphorus ions and arsenic ions from the ground major surface, and activating the implanted ions by irradiating a laser beam. See for instance, U.S. Pat. No. 6,759,301. The FZ wafer is a wafer cut out from an ingot grown by a floating zone method and is less expensive than the epitaxial wafer.

It has been reported that it is preferable for the forward voltage temperature coefficient of a diode to be positive. See for instance Michio NEMOTO, et al, *An Advanced FWD Design Concept with Superior Soft Reverse Recovery Characteristics*, (USA) ISPSD. Proceedings, (2000), pp. 119-122. For making it possible to provide an IGBT module with a high current capacity (e.g., 500 A or higher), it is sometimes necessary to connect the IGBT chips and the freewheeling diode chips (hereinafter referred to as the "FWD chips") parallel to each other. Since the positive temperature coefficient of the diode forward voltage facilitates preventing the current from localizing to a specific chip in the above-described configuration, current balance is maintained stably between the chips.

For adjusting the forward voltage temperature coefficient to be positive, it is a precondition that the minority carrier lifetime (the doped lifetime killer amount) be controlled by electron beam irradiation. See for instance Japanese published patent application 2001-177114. The platinum diffusion, which is a typical technique for controlling the minority carrier lifetime, provides the diode forward voltage with a negative temperature coefficient since the platinum energy level is shallow.

The NEMOTO, et al publication points out that the reverse recovery of the diode is liable to be the so-called hard recovery, when the electron beam irradiation is employed, and oscillations are liable to occur during the reverse recovery, since the crystal defects introduced in the semiconductor substrate by the electron beam irradiation distribute uniformly in the thickness direction of the semiconductor substrate, namely in the electron beam irradiation direction.

Therefore, for manufacturing a device with the forward voltage thereof exhibiting a positive temperature coefficient, it is necessary not only to control the minority carrier lifetime by electron beam irradiation but also to realize a crystal defect distribution suitable for realizing soft recovery. One of the known methods for realizing the preferable crystal defect distribution makes the impurity concentration in an n-type drift layer peak at the center thereof and decrease toward a p-type anode layer and an n-type cathode layer. See for instance. Japanese published patent application 2003-318412.

The method disclosed in the Japanese published application above that uses an epitaxial wafer, however, is not suitable for using the inexpensive FZ wafer, which has been used mainly in these days. Therefore, there still remains a need to develop a new method that allows use of an inexpensive FZ wafer, controlling the minority carrier lifetime by electron beam irradiation, and still obtaining soft recovery characteristics. The present invention addresses this need.

SUMMARY OF THE INVENTION

The present invention relates to a method of manufacturing semiconductor devices, such as power semiconductor devices, which method includes grinding the back surface of a semiconductor substrate. The present invention also relates to the semiconductor devices formed by the present method.

The semiconductor device can include a first semiconductor layer or substrate of a first conductivity type, a second semiconductor layer of a second conductivity type in contact with a first major surface of the first semiconductor layer, the second semiconductor layer being doped more heavily than the first semiconductor layer, a first electrode in electrical contact with the second semiconductor layer, a third semiconductor layer of the first conductivity type in contact with a second major surface of the first semiconductor layer, the third semiconductor layer being doped more heavily than the first semiconductor layer, and a second electrode in electrical contact with the third semiconductor layer.

One aspect of the present invention is a method of manufacturing the semiconductor device, which method can include irradiating a charged particle beam to one of the first or second major surface of the semiconductor substrate to introduce crystal defects into the first semiconductor layer or substrate, grinding the one major surface of the first semiconductor layer into which the crystal defects have been introduced, implanting impurity ions of the first or second conductivity type from the exposed surface of the first semiconductor layer exposed by the grinding step, and irradiating laser beams to the exposed surface of the first semiconductor layer to a predetermined depth from the defective state caused by the crystal defects introduced therein, to make the implanted impurity atoms electrically active and to recover the region from the surface of the first semiconductor layer irradiated by the laser beams. That is, the crystal defects from the above-described region are removed.

Hereinafter, the surface of the first semiconductor layer or the semiconductor substrate irradiated by laser beams will be referred to as the "laser-irradiated surface." Hereinafter, the region recovered from the defective state caused by the crystal defects introduced therein will be referred to sometimes as the "recovered region."

Although crystal defects are introduced into the first semiconductor layer by the charged particle beam irradiation, the region from the exposed surface exposed by grinding, that is the laser-irradiated surface, to a predetermined depth is recovered from the defective state caused by the crystal defects introduced therein. Since the minority carrier lifetime in the recovered region from the laser-irradiated surface to the predetermined depth is restored to the value before the charged particle beam irradiation, the soft recovery characteristics can be improved.

The charged particle beam can be irradiated after forming the second semiconductor layer and the first electrode on the first major surface of the first semiconductor layer. Since the impurity activation and crystal defects removal are conducted based on the local heating by laser beam irradiation, the second semiconductor layer doped with a predetermined concentration of impurity and the first electrode, both formed before the laser beam irradiation on the first major surface of the first semiconductor layer opposite to the second major surface irradiated with the laser beams, are not affected. Therefore, any device structure formed on the first major surface of the first semiconductor layer does not pose any problem on introducing crystal defects into the first semiconductor layer and recovering the region in the second surface portion of the first semiconductor layer from the defective state.

The region from the exposed surface of the first semiconductor layer exposed by grinding to a depth between 5% and 30% of the total substrate thickness after the grinding can be recovered from the defective state caused by the crystal defects introduced therein. Soft recovery effects are obtained primarily by recovering the region from the exposed surface of the first semiconductor layer exposed by grinding, that is the laser-irradiated surface, to the depth corresponding to 5%-30% of the total first semiconductor layer (substrate) thickness after grinding from the defective state.

The region from the exposed surface of the first semiconductor layer exposed by grinding to a depth between 10 μm and 40 μm from the exposed surface is recovered from the defective state caused by the crystal defects introduced therein. When the total first semiconductor layer thickness is 140 μm after the grinding, soft recovery effects are obtained primarily by recovering the region from the exposed surface of the first semiconductor layer exposed by grinding, that is the laser-irradiated surface, to the depth of 10 μm-40 μm from the defective state.

The laser beams are irradiated to the irradiating areas in the first semiconductor layer with a plurality of laser emitting apparatuses successively emitting respective pulsed laser beams with the succeeding pulsed laser beam delayed for a predetermined delay time from the preceding pulsed laser beam. Since it is difficult to recrystallize the area, into which crystal defects have been introduced, by the preceding pulsed laser beam, some unwanted crystal defects may remain. However, recrystallization is enhanced by the succeeding pulsed laser beam. Therefore, a plurality of pulsed laser beams are irradiated successively with the succeeding pulsed laser beam delayed for a predetermined delay time from the preceding pulsed laser beam. Thus, the region from the laser-irradiated surface to an appropriate depth is recovered from the defective state and soft recovery effects are obtained.

The irradiation areas can be irradiated with the laser beams at the total energy density of 1 J/cm$^2$ or more and 4 J/cm$^2$ or less. When the laser beams are irradiated at the total energy density of more than 1 J/cm$^2$, the region from the laser-irradiated surface to an appropriate depth of the semiconductor substrate is recovered from the defective state. When the laser beams are irradiated at the total energy density of more than 4 J/cm$^2$, abrasions are caused and the semiconductor surface is roughened, since the temperature of the laser-irradiated surface exceeds the boiling point of the semiconductor (3267° C. for silicon) to the higher side. Therefore, it is preferable to irradiate the laser beams at the total energy density of less than 4 J/cm$^2$. YAG laser beams can be used for the laser beams. By using high-energy laser beams such as YAG2 ω laser beams, the region from laser-irradiated surface to an appropriate depth can be recovered from the defective state caused by the crystal defects introduced therein.

The charged electron beam can be an electron beam. By using an electron beam, crystal defects are introduced uniformly into the semiconductor substrate. The first semiconductor layer or substrate can be formed from an FZ wafer. Since the FZ wafer is less expensive than the epitaxial wafer, the semiconductor device can be obtained with lower manufacturing costs.

The manufacturing method according to the invention that includes the step of grinding the back surface of a semiconductor substrate facilitates manufacturing a semiconductor device that exhibits soft recovery characteristics. In particular, a diode having decreased reverse recovery time and reverse recovery losses thereof and improved soft recovery characteristics thereof can be obtained. Moreover, IGBT modules and intelligent power modules (hereinafter referred to as "IPMs"), which cause low electrical losses and low radiative electromagnetic noises and consider the environmental problems, can be formed.

Another aspect of the present invention is the semiconductor substrate formed by the above method.

BRIEF DESCRIPTION OF THE DRAWINGS

FIG. 9 shows the reverse recovery waveforms of the diode characterized by B in FIG. 5 and incorporated in the single-phase chopper circuit shown in FIG. 11.

FIG. 10 shows the reverse recovery waveforms of the diode characterized by C in FIG. 5 and incorporated in the single-phase chopper circuit shown in FIG. 11.

DETAILED DESCRIPTION

Figure 1:
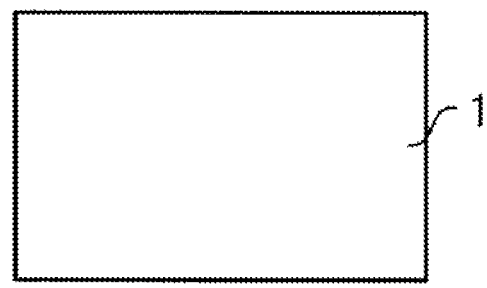
FIG. 1 schematically illustrates a cross-sectional view of a semiconductor device formed by one manufacturing method according to the present invention.

The present invention will be described in detail hereinafter with reference to the accompanied drawings, which illustrate the specific exemplary embodiments according to the present invention. In the following descriptions, the n-type layer or the n-type region is a layer or a region where the electrons are majority carriers. The p-type layer or the p-type region is a layer or a region where the holes are majority carriers. The superscript "+" following the letter "n" or "p" indicating the conductivity type of the layer or the region indicates that the layer or the region is doped relatively heavily. The superscript "−" following the letter "n" or "p" indicating the conductivity type of the layer or the region indicates that the layer or the region is doped relatively lightly. Throughout the following descriptions and the attached drawings, the same reference numerals are used to designate the same or like constituent elements and their duplicated explanations are omitted for the sake of simplicity.

The present inventors have explored research and development intensively and found that a YAG laser can facilitate recovery of the defective region of the semiconductor surface by irradiating with the laser to a certain depth from the defective state caused by the crystal defects introduced therein by electron beam irradiation. Annealing of the defective region, caused by the crystal defects introduced therein, using the second harmonic of a YAG laser (hereinafter referred to as the "YAG2 ω laser beam") is disclosed in detail in U.S. published patent application 2005/0059263, which corresponds to. Japanese published patent application 2005-223301.

Figure 2:
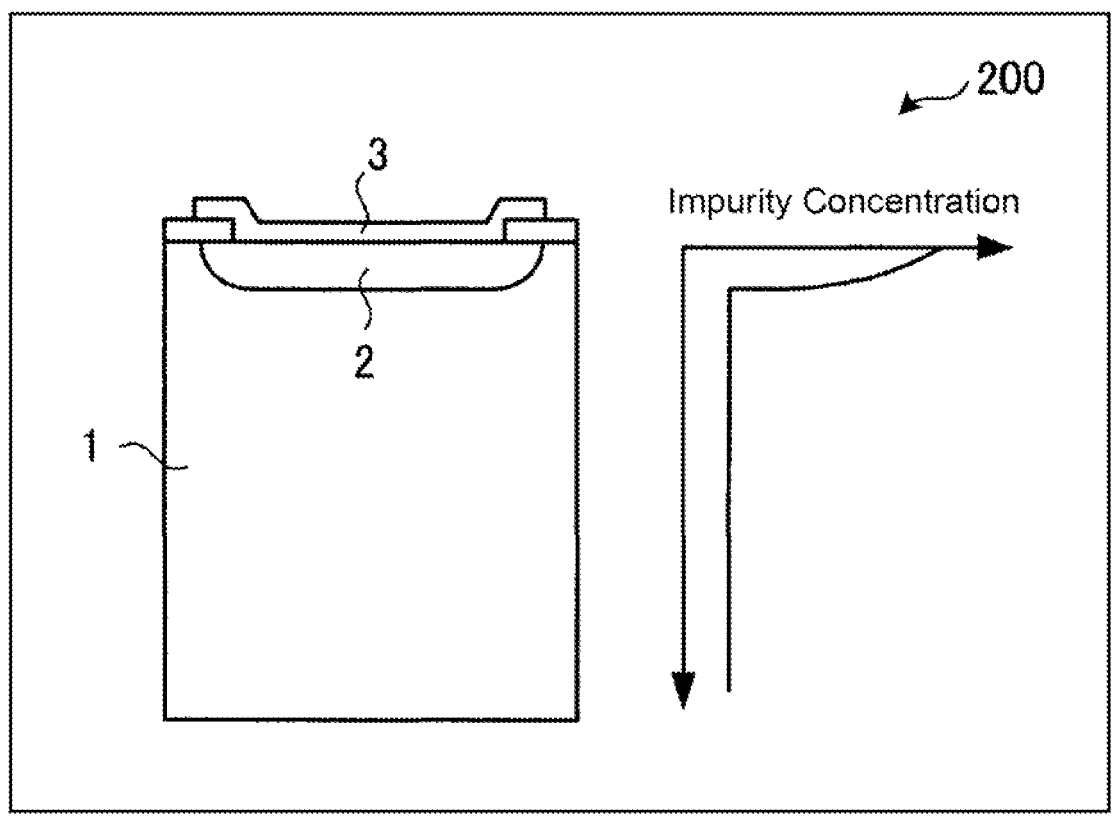
FIG. 2 schematically illustrates another cross-sectional view of the semiconductor device formed by the manufacturing method with the impurity concentration profile in the cross section thereof.

Referring to FIG. 1, an $n^-$-type FZ wafer of 5 inch in diameter, for example, is prepared for a semiconductor substrate 1. The specific resistance of semiconductor substrate 1 is 40 to 70 Ω·cm for the device of the 1200 V breakdown voltage class. The semiconductor substrate 1 is used as a first semiconductor layer. Referring now to FIG. 2, a p-type anode layer 2 working as a second semiconductor layer and a guard ring structure (not illustrated) are formed on the first major surface of semiconductor substrate 1 through the conventional process for manufacturing a diode. An anode electrode 3 is formed as a first electrode in ohmic contact with the p-type anode layer 2. FIG. 2 shows the impurity concentration profile 200 in the cross section after the anode electrode 3 is formed.

Thereafter, an ionized charged particle beam such as an electron beam is irradiated to the semiconductor substrate 1 to introduce crystal defects into the semiconductor substrate 1, followed by a thermal treatment. Then, the second major surface of the wafer (i.e., semiconductor substrate 1) is ground and etched, for example, by wet etching to form the wafer having a predetermined thickness. Generally, the wafer thickness for the 1200 V breakdown voltage class, for example, is 100 to 160 μm. Then, impurity ions are implanted from the surface of the semiconductor substrate 1 exposed by the grinding and etching processes (hereinafter simply referred to as the "exposed surface") to introduce the impurity into the semiconductor substrate 1.

Then, laser beams are irradiated using the double pulse method from YAG2 ω lasers (and such lasers) to the exposed surface. The double pulse method successively irradiates areas with a plurality of laser irradiating apparatuses emitting respective pulsed laser beams with the succeeding pulsed laser beam delayed for a predetermined delay time from the preceding pulsed laser beam. The double pulse method is disclosed, for example, in U.S. published patent application 2005/0059263 mentioned previously.

According to one embodiment, the energy density, at which the laser beams are irradiated by the double pulse method, is 1 $J/cm^2$ or higher and 4 $J/cm^2$ or lower in total for every laser beam irradiation area. The impurities in the semiconductor substrate 1 are made to be electrically active by the laser beam irradiation and an $n^+$-type cathode layer 4 working as a third semiconductor layer is formed.

Figure 3:
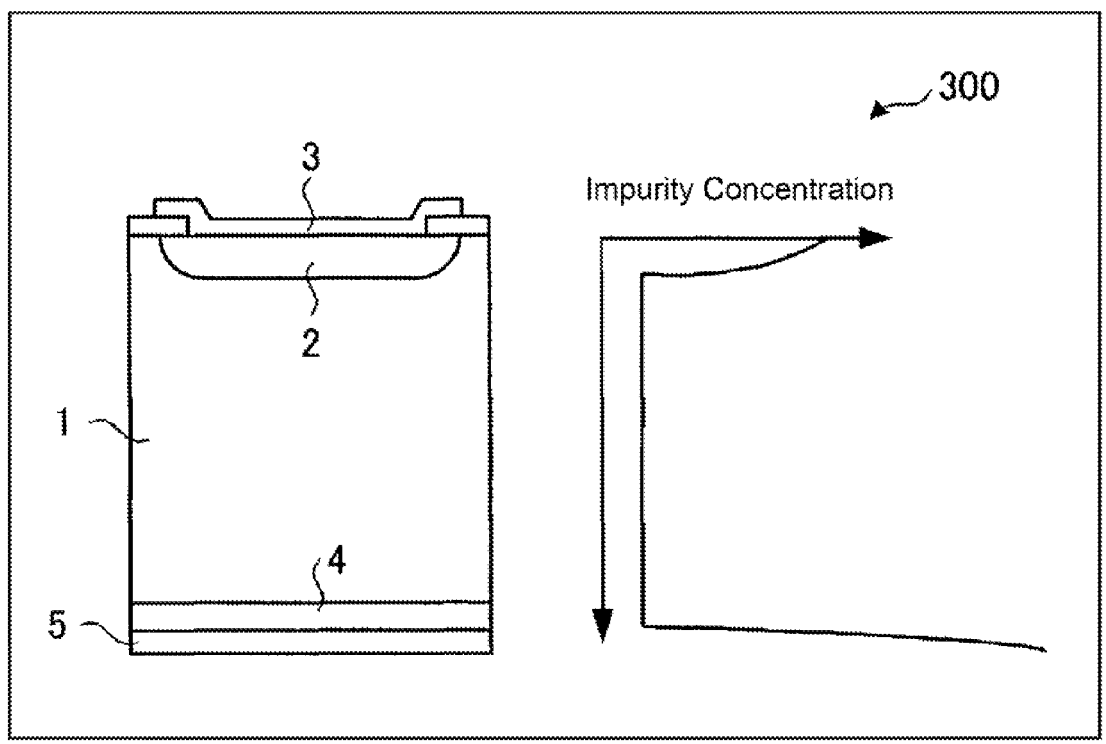
FIG. 3 schematically illustrates still another cross-sectional view of the semiconductor device form by the manufacturing method with the impurity concentration profile in the cross section thereof.

Among the crystal defects introduced into the semiconductor substrate 1 by the charged particle irradiation, the crystal defects introduced into the region from the exposed surface to a depth corresponding to 5% or more and 30% or less of the total substrate thickness after the grinding process are removed to recover the region from the defective state caused by the crystal defects introduced therein. When the total substrate thickness is, for example, 140 μm after the grinding process, the region from the laser beam irradiated surface to a depth between 10 μm and 40 μm is recovered from the defective state. Then, a titanium (Ti) layer, a nickel (Ni) layer, and a gold (Au) layer can be laminated on the exposed surface in this order to form a cathode electrode 5 working as a second electrode. See FIG. 3, which illustrates the impurity concentration profile 300 in the cross section after the cathode electrode 5 is formed.

Figure 4:
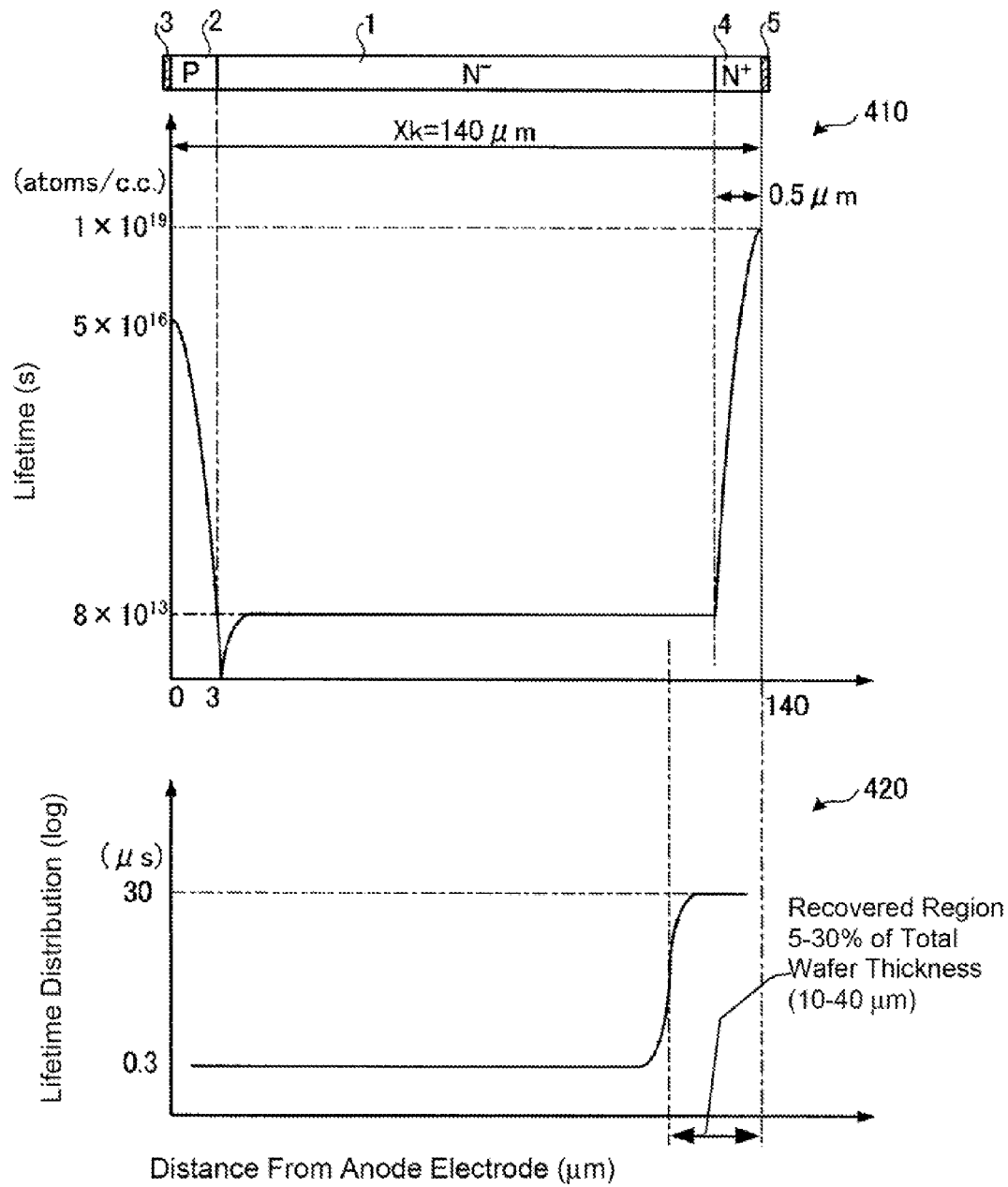
FIG. 4 schematically illustrates a cross-sectional structure of a diode manufactured by the method according to the present invention and the characteristics thereof.

Now the characteristics of the diode manufactured as described above will be described below. FIG. 4 shows the structure and the characteristics of the diode manufactured as described above. In detail, FIG. 4 schematically illustrates a cross-sectional view of the diode, a curve 410 relating the distance from the anode electrode 3 with the net doping concentration, and a curve 420 relating the distance from the anode electrode 3 with the minority carrier lifetime distribution. The horizontal axes for the curves 410 and 420 correspond to the distance from the anode electrode 3 in the above cross-section.

In this exemplary embodiment, the chip size is set at 10 mm×10 mm so that the breakdown voltage of the 1200 V class and the rated current of 150 A may be realized. The specific resistance of semiconductor substrate 1 is 60 Ωcm. The phosphorus concentration in the semiconductor substrate 1 is $8.0 \times 10^{13}$ atoms/cc. The impurity concentration in the p-type anode layer 2 is $5 \times 10^{16}$ atoms/cc. The depth of the p-type anode layer 2 is 3 μm. The anode electrode 3 is made of. Al containing 1 weight % of. Si.

Crystal defects can be introduced by irradiating an electron beam at the acceleration voltage of 4.8 MeV and the dosage of 100 kGy. After the electron beam irradiation, a heat treatment can be conducted at 350° C. for 1 hr. Then, the wafer can be ground and etched by wet etching so that the thickness of the wafer becomes 140 μm. For forming the $n^+$-type cathode layer 4, phosphorus ions can be implanted at the acceleration voltage of 50 keV and the dose amount of $1 \times 10^{19}$ atoms/$cm^2$. The irradiation from YAG2 ω lasers can be conducted at the total irradiated energy density of 3 $J/cm^2$ and with the delay time between the preceding and succeeding pluses (hereinafter referred to as the "irradiation delay time") of 300 ns.

Figure 5:
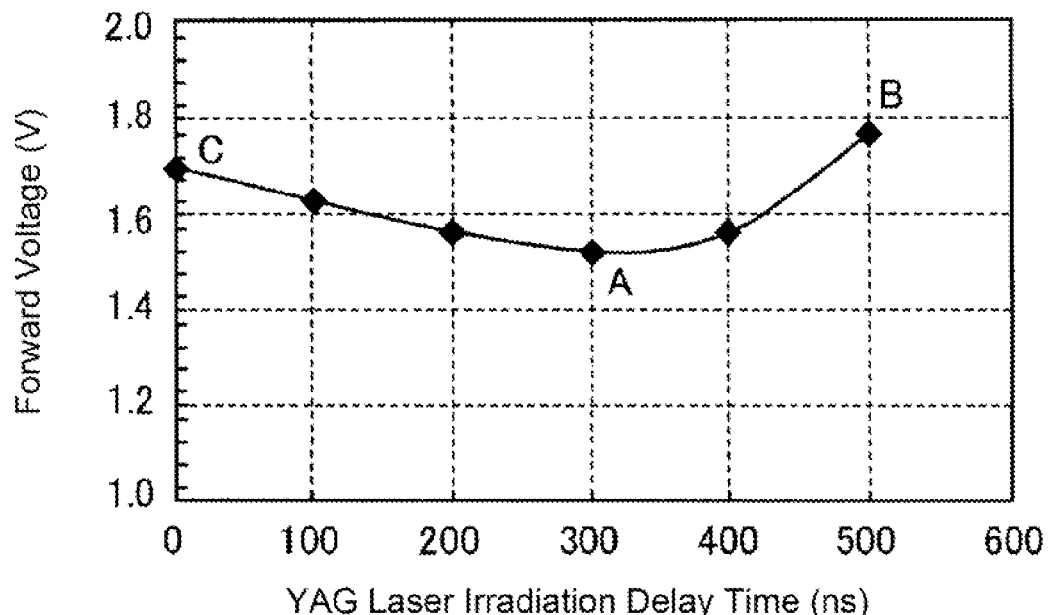
FIG. 5 shows a curve relating the YAG laser irradiation delay time between the preceding and succeeding pulses with the forward voltage (at the room temperature) of the diode shown in FIG. 4.

Experimental diodes are fabricated by irradiating YAG laser beams at various irradiation delay times. By investigating the electrical characteristics of the fabricated experimental diodes, it has been found that the forward voltage can be changed by changing the irradiation delay time. FIG. 5 shows a curve relating the YAG laser irradiation delay time with the forward voltage (at the room temperature) of the diode shown in FIG. 4 at 150 A. From FIG. 5, the forward voltages at the irradiation delay times 0 ns, 100 ns, 200 ns, 300 ns, 400 ns, and 500 ns are 1.7 V, 1.64 V, 1.56 V, 1.52 V, 1.56 V and 1.76 V, respectively.

The reason why the forward voltage variations are formed will be described below. As is known, the crystal defects introduced by the electron beam irradiation distribute uniformly throughout the wafer before irradiating the YAG laser beams. By irradiating YAG laser beams under the above-described conditions after grinding and polishing the wafer and implanting phosphorus ions into the ground and polished wafer, the region from the laser-irradiated surface to the depth of about 2.6 μm is heated to 1414° C. or higher and the silicon in the region is melted.

As soon as the YAG laser beam irradiation ends, the temperature lowers rapidly at the time constant of the 100 ns order and the temperature 1 μsec after the end of the laser beam irradiation at the locations 30 μm deep from the laser-irradiated surface is about 500° C. Since the temperature in the region from the laser-irradiated surface to the depth of 30 μm is higher than 500° C., the region from the laser-irradiated surface to the depth of 30 μm can be recovered easily from the defective state, caused by the crystal defects introduced therein by the electron beam irradiation. Therefore, the minority carrier lifetime in the recovered region can be restored to the value before the electron beam irradiation (about 30 μs).

Figure 6:
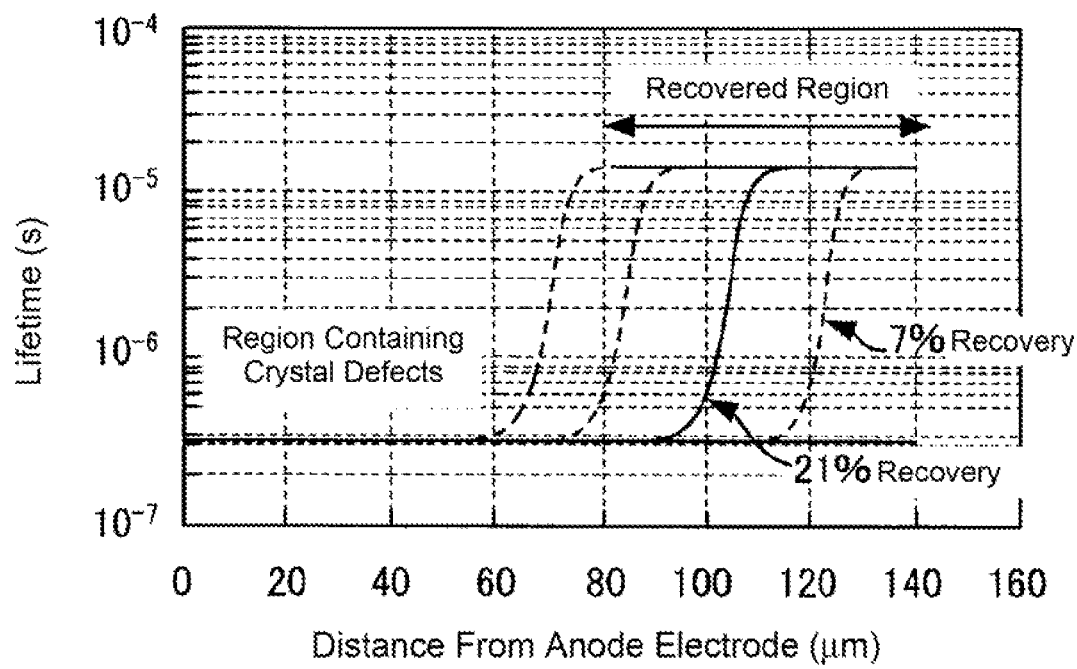
FIG. 6 shows curves of the minority carrier lifetime distributions.

The minority carrier lifetime distributions are assumed by device simulation and the forward voltages are calculated for the minority carrier lifetime distributions. FIG. 6 shows curves describing the assumed minority carrier lifetime distributions. In FIG. 6, the horizontal axis represents the distance from the anode electrode 3 and the vertical axis the minority carrier lifetime. The boundary between the $n^+$-type cathode layer 4 and the cathode electrode 5 is set at the position of 140 μm.

Here, the conventional uniform minority carrier lifetime assuming the electron beam irradiation is put at 0.35 μs. In FIG. 6, the recovered regions, the width thereof from the boundary between the $n^+$-type cathode layer 4 and the cathode electrode 5 is 20 μm (7% recovery in FIG. 6), 40 μm (21% recovery in FIG. 6), 60 μm, 80 μm, 100 μm, 120 μm, and 140 μm, can be recovered from the defective state caused by the crystal defects introduced therein, and the minority carrier lifetime in the recovered regions can be 15 μs. The minority carrier lifetime in the regions adjacent to the anode electrode 3 (the regions on the anode electrode side) is assumed to be 0.35 μs.

Figure 7:
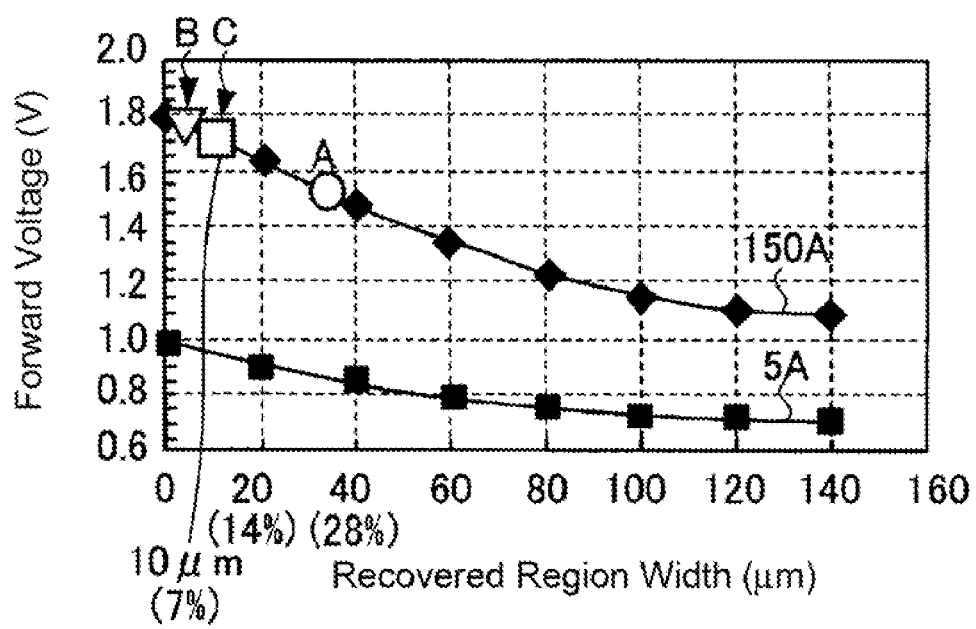
FIG. 7 shows curves relating the forward voltage with the width of the recovered region recovered from the defective state caused by the crystal defects introduced therein.

FIG. 7 shows curves relating the forward voltage with the width of the recovered region, recovered from the defective state, at the currents of 150 A and 5 A assuming the minority carrier lifetime distributions as shown in FIG. 6. The recovered region width is the width of the region, in which the minority carrier lifetime is 15 μs.

FIG. 7 indicates that as the recovered region width becomes wider, the forward voltage becomes lower at the currents of 150 A and 5 A. At the current of 150 A, the forward voltage for the recovered region width of 20 μm (about 14% of the final total wafer thickness) is lower by 0.2 V than the forward voltage at the recovered region width of 0 μm, (i.e., no region recovered from the defective state).

The measured values in FIG. 5 indicate that the semiconductor substrate has been best recovered from the defective state when the lowest forward voltage is obtained, at 150 A by irradiating the YAG laser beams with the irradiation delay time of 300 ns between the preceding and succeeding pulses (the forward voltage being about 1.52 V at. A in FIG. 5). At 150 A, the recovered region width corresponding to the forward voltage of 1.52 V is about 30 μm as indicated by. A in FIG. 7. In other words, the lowest forward voltage can be obtained when the region corresponding to about 21% of the final total wafer thickness is recovered from the defective state. In other words, for obtaining the lowest forward voltage, it is necessary to recover the region corresponding to about 21% of the final total wafer thickness from the defective state caused by the crystal defects introduced therein. As shown in FIG. 7, when the irradiation delay time is 500 ns and the forward voltage is about 1.76 V (B in FIG. 5), the width of the recovered region recovered from the defective state is about 5 μm (about 3% of the final total wafer thickness). When the irradiation delay time is 0 ns and the forward voltage is about 1.7 V (C in FIG. 5), the width of the recovered region, recovered from the defective state, is about 10 μm (about 7% of the final total wafer thickness).

Figure 8:
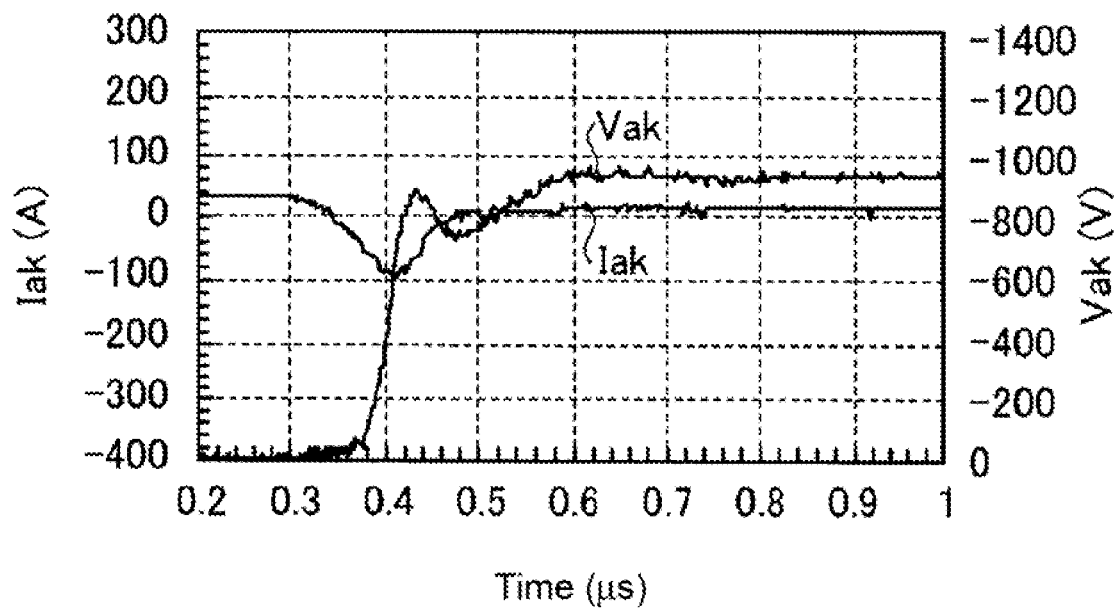
FIG. 8 shows the reverse recovery waveforms of the diode characterized by. A in FIG. 5 and incorporated in a single-phase chopper circuit shown in FIG. 11.
Figure 11:
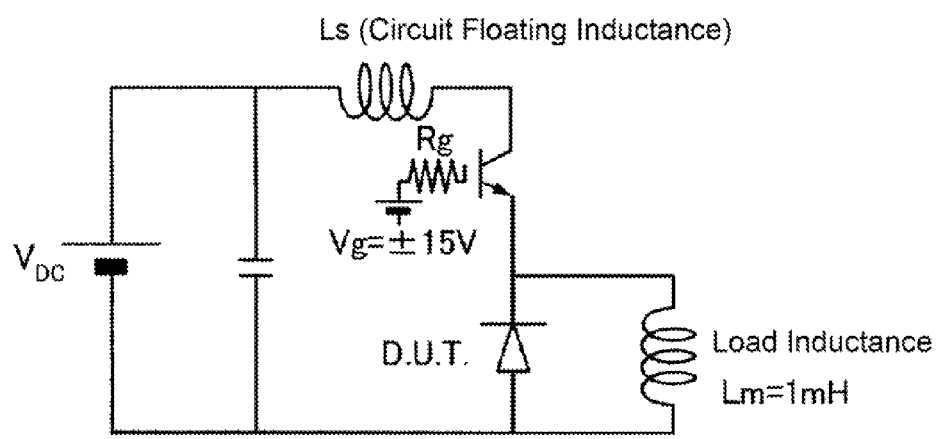
FIG. 11 schematically illustrates a block circuit diagram of a single-phase chopper circuit.

FIG. 8 shows the reverse recovery waveforms of the diode characterized by. A in FIG. 5 and incorporated in a single-phase chopper circuit 10 shown in FIG. 11. FIG. 9 shows the reverse recovery waveforms of the diode characterized by B in FIG. 5 and incorporated in single-phase chopper circuit 10 shown in FIG. 11. FIG. 10 shows the reverse recovery waveforms of the diode characterized by C in FIG. 5 and incorporated in single-phase chopper circuit 10 shown in FIG. 11. In these drawings, Iak represents the anode current and Vak the voltage between the anode and the cathode. In single-phase chopper circuit 10, the reverse recovery forward current is 15 A (i.e., 1/10 the rated current), the DC bias voltage is 900 V, and the load inductance. Lm is 1 mH. The switching IGBT in single-phase chopper circuit 10 is a standard field-stop-type (FS-type) IGBT of 1200 V/150 A, the gate resistance thereof is 0Ω on the ON-side and 33Ω on the OFF-side. The main circuit floating inductance. Ls is 200 nH.

As FIGS. 8-10 illustrate, the diode. A, which has been best recovered from the defective state, does not cause any oscillation and conducts soft recovery. The diode C oscillates. The diode B is obviously oscillating and the peak voltage thereof is much higher than the peak voltages of the diodes. A and C. Therefore, for realizing soft recovery, it is effective to widen the recovered region to be recovered from the defective state. However, it is meaningless to recover the entire wafer from the defective state.

The results described above clearly indicate that the soft recovery effects will be obtained, if the wafer region from the boundary between the $n^+$-type cathode layer 4 and the cathode electrode 5 to the depth corresponding to 5% or more of the total thickness of the thinned wafer is recovered from the defective state caused by the crystal defects introduced therein. By recovering the wafer region from the boundary between the $n^+$-type cathode layer 4 and the cathode electrode 5 to the depth corresponding to 20 to 30% of the total thickness of the thinned wafer from the defective state, sufficient soft recovery effects can be obtained.

If one wants to recover the wafer region from the boundary between the $n^+$-type cathode layer 4 and the cathode electrode 5 to the depth corresponding to more than 30% of the total thickness of the thinned wafer from the defective state, it will be necessary to set the irradiated energy density from the YAG laser greater than 4 J/cm$^2$. Since the laser-irradiated surface temperature exceeds the boiling point of silicon (3267° C.) to the higher side when the irradiated laser energy density is greater than 4 J/cm$^2$, abrasions are caused and the laser-irradiated surface is roughened. Therefore, it is preferable for the recovered region recovered from the defective state to be in the range from the laser-irradiated surface to the depth corresponding to 30% of the total thickness of the thinned wafer.

Solely for activating the phosphorus atoms implanted from the exposed surface to form the $n^+$-type cathode layer 4 and the $n^+$-type cathode layer 4, the contact resistance thereof can be sufficiently low and may be obtained by irradiating pulsed YAG laser beams at the irradiated energy density of less than 1 J/cm², e.g., 500 mJ/cm², and with the irradiation delay time of 0 ns (i.e., without delay). Alternatively to the YAG laser, similar effects may be obtained by an excimer laser with a low energy density. For introducing crystal defects by irradiating a light charged particle beam such as an electron beam according to the invention and for realizing soft recovery, it is necessary to irradiate YAG laser beams by the double pulse method so that a crystal defect distribution, i.e., a minority carrier lifetime distribution, preferable for the soft recovery can be obtained.

The same method is applicable to the diodes of other than the 1200 V breakdown voltage class, e.g., for the diode of the 600 V breakdown voltage class. For the diode of the 600 V breakdown voltage class, the specific resistance of the semiconductor substrate is adjusted to be 15 to 30 Ωcm, e.g., 20 Ωcm, and the final wafer thickness after grinding and polishing to be 50 to 70 µm, e.g., 60 µm. If the electron beam dosage is adjusted at 300 kGy, the irradiation energy density of the YAG laser beams at 2.8 J/cm², and the irradiation delay time at 300 ns, the forward voltage will be 1.3 V at the forward current density of 400 A/cm².

If the irradiation delay time is set at 500 ns while the other conditions are unchanged, the forward voltage will be 1.6 V and the similar characteristics as described in FIG. 5 will be obtained. No oscillation is caused on the reverse recovery waveforms of the diode from the DC bus voltage of 500 V and from the current density of 400 A/cm², when the irradiation delay time is 300 ns. Oscillations are caused on the reverse recovery waveforms of the diode from the DC bus voltage of 500 V and from the current density of 400 A/cm², when the irradiation delay time is 500 ns.

The above method is applicable not only to the diodes but also to the usual IGBTs and the reverse blocking IGBTs. The IGBTs, to which the invention can be applied, facilitate realizing low-loss turnoff and preventing oscillations. Specifically, the method of manufacturing a reverse blocking IGBT can include, for instance, the step of preparing an FZ bulk wafer, the step of forming a gate structure, an emitter structure, and an edge structure on the wafer front surface, the step of irradiating an electron beam at the dosage of 100 kGy or less, the step of grinding and polishing the wafer back surface until the final total wafer thickness is around 100 µm, the step of implanting boron ions from the exposed wafer surface exposed by grinding, and the step of irradiating laser beams to activate the implanted boron atoms.

In the turnoff, a depletion layer expands from the front surface in the same manner as in the reverse recovery of the diode and the carriers are diminishing. However, since the carriers can be prevented from diminishing rapidly in the same manner as in the diode, smooth turnoff can be realized without causing any oscillation. Therefore, it is possible to manufacture a soft recovery diode with low-losses or to manufacture an IGBT that facilitates turning off smoothly without causing any oscillation. Moreover, breakdown due to an over voltage and noises due to electromagnetic interference (EMI noises) can be prevented in the PWM inverter and such an electric power converter, which employs the IGBT module exhibiting the characteristics as described above.

Figure 12:
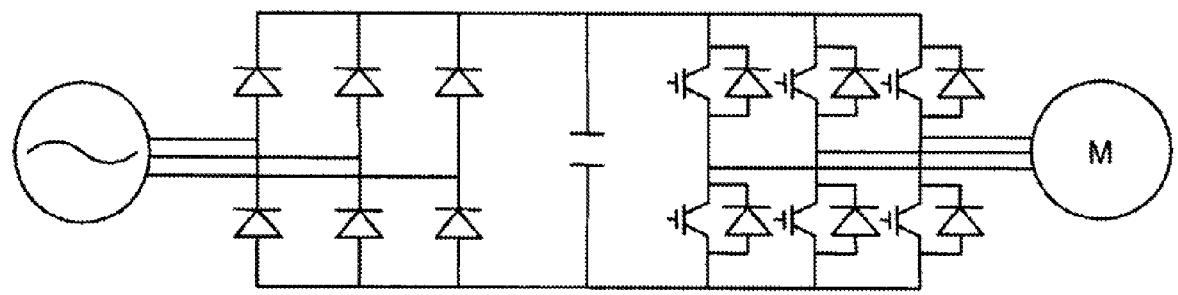
FIG. 12 schematically illustrates a block circuit diagram of an inverter-converter for AC to AC conversion.
Figure 13:
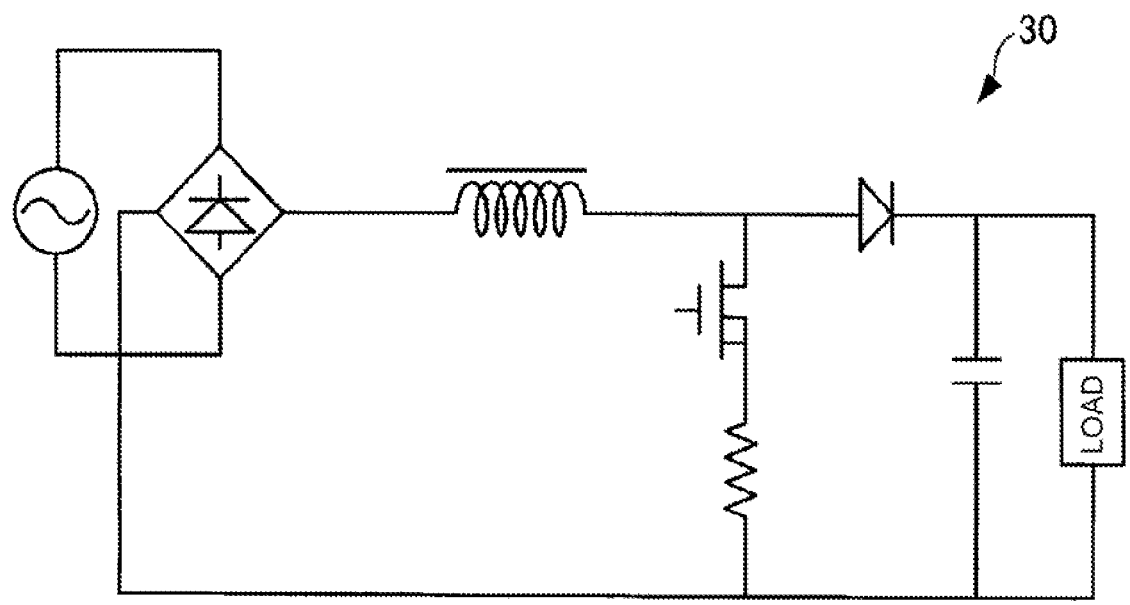
FIG. 13 schematically illustrates a block circuit diagram of a power factor improving circuit.

FIGS. 12 and 13 show application examples of the diode and FS-type IGBT according to the invention. The inverter-converter 20 for AC to AC conversion shown in FIG. 12, which facilitates controlling an induction motor, a servo motor, and such a motor, is used widely in industries and electric railway companies. The power factor improving circuit (PFC) 30 shown in FIG. 13 is a circuit for controlling the input current subjected to AC to AC conversion to be sinusoidal to improve the waveform thereof and is used for switching power supplies.

According to the embodiment of the invention, the reverse recovery time and reverse recovery losses of the diode can be decreased greatly as compared with those formed by the conventional techniques, and the soft recovery characteristics of the diode can be improved. Moreover, IGBT modules and IPMs that cause low electrical losses and low radiative electromagnetic noises and consider the environmental problems are attainable.

As described above, the method of manufacturing a semiconductor device according to the invention is useful for manufacturing a power semiconductor device. Especially, the method of manufacturing a semiconductor according to the invention is best suited for manufacturing a high-speed and low-loss diode or a high-speed and low-loss IGBT that exhibits soft recovery characteristics.

Many modifications and variations may be made to the techniques and structures described and illustrated herein without departing from the spirit and scope of the invention. For example, the concentrations and dimensions described herein are exemplary and not limiting upon the scope of the invention. Although the first conductivity type is an n-type and the second conductivity type is a p-type in the above descriptions, the present invention is applicable to the semiconductor devices in which the first conductivity type is a p-type and the second conductivity type is an n-type.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-246037, filed on 26 Aug. 2005. The disclosure of the priority application, in its entirety, including the drawings, claims, and the specification thereof, is incorporated herein by reference.

What is claimed is:

1. A method of manufacturing a semiconductor device comprising a first semiconductor layer of a first conductivity type; a second semiconductor layer of a second conductivity type in contact with a first major surface of the first semiconductor layer, the second semiconductor layer being doped more heavily than the first semiconductor layer; a first electrode in electrical contact with the second semiconductor layer; a third semiconductor layer of the first conductivity type in contact with a second major surface of the first semiconductor layer, the third semiconductor layer being doped more heavily than the first semiconductor layer; and a second electrode in electrical contact with the third semiconductor layer, the method comprising the steps of:

irradiating a charged particle beam to one of the first major surface or the second major surface of the first semiconductor layer to introduce crystal defects into the first semiconductor layer after forming the second semiconductor layer and the first electrode on the first major surface of the first semiconductor layer;

grinding the one major surface of the first semiconductor layer into which the crystal defects have been introduced;

implanting impurity ions of the first or second conductivity type from the surface of the first semiconductor layer exposed by the grinding step; and irradiating laser beams to the exposed surface of the first semiconductor layer to a predetermined depth from the defective state caused by the crystal defects introduced therein, to make the implanted impurity atoms electrically active and to recover the region from the surface of the first semiconductor layer irradiated by the laser beams.

2. The method according to claim 1, wherein the region from the exposed surface of the first semiconductor layer exposed by the grinding step to a depth between 5% and 30% of the total substrate thickness after the grinding step is recovered from the defective state caused by the crystal defects introduced therein.

3. The method according to claim 2, wherein the step of irradiating laser beams comprises irradiating areas in the first semiconductor layer with a plurality of laser emitting apparatuses successively emitting respective pulsed laser beams delayed for a predetermined delay time from each other.

4. The method according to claim 3, wherein the areas are irradiated with the laser beams at the total energy density of 1 J/cm$^2$ or more and 4 J/cm$^2$ or less.

5. The method according to claim 4, wherein the laser beams comprise YAG laser beams.

6. The method according to claim 5, wherein the charged particle beam comprises an electron beam.

7. The method according to claim 6, wherein the first semiconductor layer is a semiconductor substrate formed of an FZ wafer.

8. The method according to claim 5, wherein the first semiconductor layer is a semiconductor substrate formed of an FZ wafer.

9. The method according to claim 2, wherein the charged particle beam comprises an electron beam.

10. The method according to claim 9, wherein the first semiconductor layer is a semiconductor substrate formed of an FZ wafer.

11. The method according to claim 1, wherein the region from the exposed surface of the first semiconductor layer exposed by the grinding step to a depth between 10 μm and 40 μm from the exposed surface is recovered from the defective state caused by the crystal defects introduced therein.

12. The method according to claim 11, wherein the step of irradiating laser beams comprises irradiating areas in the first semiconductor layer with a plurality of laser emitting apparatuses successively emitting respective pulsed laser beams delayed for a predetermined delay time from each other.

13. The method according to claim 12, wherein the areas are irradiated with the laser beams at the total energy density of 1 J/cm$^2$ or more and 4 J/cm$^2$ or less.

14. The method according to claim 13, wherein the laser beams comprise YAG laser beams.

15. The method according to claim 14, wherein the charged particle beam comprises an electron beam.

16. The method according to claim 15, wherein the first semiconductor layer is a semiconductor substrate formed of an FZ wafer.

17. The method according to claim 14, wherein the first semiconductor layer is a semiconductor substrate formed of an FZ wafer.

18. The method according to claim 11, wherein the charged particle beam comprises an electron beam.

19. The method according to claim 18, wherein the first semiconductor layer is a semiconductor substrate formed of an FZ wafer.

20. The method according to claim 1, wherein the charged particle beam comprises an electron beam.

21. The method according to claim 20, wherein the first semiconductor layer is a semiconductor substrate formed of an FZ wafer.

22. A semiconductor device formed according to the method of claim 2.

* * * * *